United States Patent
Dinev et al.

(10) Patent No.: US 9,023,227 B2
(45) Date of Patent: May 5, 2015

(54) INCREASED DEPOSITION EFFICIENCY AND HIGHER CHAMBER CONDUCTANCE WITH SOURCE POWER INCREASE IN AN INDUCTIVELY COUPLED PLASMA (ICP) CHAMBER

(75) Inventors: Jivko Dinev, Santa Clara, CA (US); Saravjeet Singh, Santa Clara, CA (US); Khalid M. Sirajuddin, San Jose, CA (US); Tong Liu, San Jose, CA (US); Puneet Bajaj, Mountain View, CA (US); Rohit Mishra, Santa Clara, CA (US); Sonal A. Srivastava, Fremont, CA (US); Madhava Rao Yalamanchili, Morgan Hill, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 99 days.

(21) Appl. No.: 13/480,967

(22) Filed: May 25, 2012

(65) Prior Publication Data

US 2013/0005152 A1    Jan. 3, 2013

Related U.S. Application Data

(60) Provisional application No. 61/503,558, filed on Jun. 30, 2011.

(51) Int. Cl.
*B44C 1/22* (2006.01)
*H01L 21/3065* (2006.01)
*H01L 21/768* (2006.01)

(52) U.S. Cl.
CPC .... *H01L 21/30655* (2013.01); *H01L 21/76898* (2013.01)

(58) Field of Classification Search
USPC .......... 216/67, 69, 79; 438/706, 710; 427/569
See application file for complete search history.

(56) References Cited

U.S. PATENT DOCUMENTS

| | | | | |
|---|---|---|---|---|
| 5,545,289 | A * | 8/1996 | Chen et al. ..................... | 438/694 |
| 6,635,185 | B2 * | 10/2003 | Demmin et al. ................ | 216/64 |
| 7,850,836 | B2 * | 12/2010 | Dixit et al. ...................... | 205/84 |
| 8,008,134 | B2 * | 8/2011 | Conn ............................. | 438/128 |
| 2004/0124177 | A1 * | 7/2004 | Urban et al. .................... | 216/67 |
| 2007/0257689 | A1 * | 11/2007 | Dalton et al. .................. | 324/758 |
| 2009/0272717 | A1 | 11/2009 | Pamarthy et al. | |
| 2010/0055400 | A1 | 3/2010 | Farr et al. | |
| 2010/0173494 | A1 * | 7/2010 | Kobrin .......................... | 438/694 |
| 2010/0242765 | A1 * | 9/2010 | Cruchon-Dupeyrat et al. ........................ | 101/463.1 |
| 2011/0006284 | A1 * | 1/2011 | Cho et al. ....................... | 257/14 |

* cited by examiner

*Primary Examiner* — Shamim Ahmed
(74) *Attorney, Agent, or Firm* — Patterson & Sheridan, LLP

(57) ABSTRACT

Embodiments described herein generally relate to a substrate processing system and related methods, such as an etching/deposition method. The method comprises (A) depositing a protective layer on a first layer disposed on a substrate in an etch reactor, wherein a plasma source power of 4,500 Watts or greater is applied while depositing the protective layer, (B) etching the protective layer in the etch reactor, wherein the plasma source power of 4,500 Watts or greater is applied while etching the protective layer, and (C) etching the first layer in the etch reactor, wherein the plasma source power of 4,500 Watts or greater is applied while etching the first layer, wherein a time for the depositing a protective layer (A) comprises less than 30% of a total cycle time for the depositing a protective layer (A), the etching the protective layer (B), and the etching the first layer (C).

20 Claims, 7 Drawing Sheets

INCREASED DEPOSITION EFFICIENCY AND HIGHER CHAMBER CONDUCTANCE WITH SOURCE POWER INCREASE IN AN INDUCTIVELY COUPLED PLASMA (ICP) CHAMBER

CROSS-REFERENCE TO RELATED APPLICATIONS

This application claims benefit of U.S. Provisional Patent Application Ser. No. 61/503,558, filed Jun. 30, 2011, which is herein incorporated by reference in its entirety.

BACKGROUND

1. Field

Embodiments described herein generally relate to a substrate processing system and related methods, such as an etching/deposition method.

2. Description of the Related Art

The fabrication of microelectronic devices includes a number of different stages, each including a variety of processes. During one stage, a particular process may include imparting a plasma to the surface of a substrate, such as a silicon substrate, to alter the physical and material properties of the substrate. This process may be known as etching, which may involve the removal of materials to form holes, vias, and/or other openings (referred to herein as "trenches") in the substrate.

Plasma etch reactors are commonly used for etching trenches in semiconductor substrates. These reactors contain a chamber within which the substrate is supported. At least one reactive gas is supplied to the chamber and a radio frequency signal is coupled to the reactive gas to form the plasma. The plasma etches the substrate that is positioned within the reactor. The substrate may also be coupled to a radio frequency (RF) signal to bias the substrate during the etching process to enhance etching performance and trench profile.

These trench profiles often require different critical dimensions. The critical dimensions include width, depth, aspect ratio, resist selectivity, roughness of the sidewalls, and planarity of the sidewalls. These critical dimensions may be controlled by various factors, two of which are etching time and etching rate, which further depend on the materials being etched and the type of etching system being used.

One material of particular importance is silicon. Through silicon via ("TSV") etching is a unique application that requires a low frequency bias and a low temperature environment to form deep trenches in a silicon substrate. However, during fabrication, the silicon is generally covered by multiple layers of other materials, such as an oxide layer and a metal layer that are deposited on the silicon. Oxides include different etching requirements than that of silicon, such as a high frequency bias. In addition, during deposition, a thin film polymer layer may be deposited onto the layers of the substrate as the trench is being formed to protect the trench sidewalls prior to etching. This polymer layer may further include different etching requirements than the oxide, metal, or silicon layers. These distinct requirements influence and increase the complexity of the type of etching system used.

One type of etching system may include in situ plasma etching. Using this first type of etching system, a trench can be formed by alternating the removal and deposition of material on a substrate in a single reactor with a removing plasma and a deposition plasma. Another type of etching system may include remote plasma etching. Using this second type of etching system, a trench can be formed as in the in situ system, except that the plasmas may be generated in a remote reactor prior to being introduced onto the substrate located in the primary reactor. In addition to the types of etching systems, the process of etching with each system may also vary. Some etching processes employ multi-step approaches, such as a time multiplexed gas modulation ("TMGM") system or a Bosch system, that includes several recipe steps, such as etch and deposition, or etch, flash, and deposition. The TMGM process etches a material for a period of time and then deposits a protective film upon the previously etched surface to protect the surface, typically the sidewalls of the trench, from further etching. These two steps are defined as a cycle and are repeated as a deeper and deeper trench is formed. The number of cycles in the TMGM process depends upon the required depth of the via and the etch rate of the process. The number of cycles may exceed 1,500 for some processes. Thus it is desirable to decrease each cycle time in order to decrease the cost of ownership.

Further, one critical dimension of particular importance when forming a trench, the roughness of the sidewalls, may render a microelectronic device defective if not properly controlled. During the etching cycles, material is being deposited and removed as the trench is formed. In response, a series of "peaks" and "valleys" may develop along the sidewalls of the trench, a phenomenon known as "scalloping." Numerous and larger peaks and valleys increase the roughness of the sidewalls of the trenches.

Therefore, there is a need for an improved method and apparatus of an etching system and process which reduces the cost of ownership while maintaining a desired etch profile.

SUMMARY

Embodiments described herein generally relate to a substrate processing system and related methods, such as an etching/deposition method. In one embodiment a method of etching a substrate in a chamber is provided. The method comprises (A) depositing a protective layer on a first layer disposed on a substrate in an etch reactor, wherein a plasma source power of 4,500 Watts or greater is applied while depositing the protective layer, (B) etching the protective layer in the etch reactor, wherein the plasma source power of 4,500 Watts or greater is applied while etching the protective layer, and (C) etching the first layer in the etch reactor, wherein the plasma source power of 4,500 Watts or greater is applied while etching the first layer, wherein a time for the depositing a protective layer (A) comprises less than 30% of a total cycle time for the depositing a protective layer (A), the etching the protective layer (B), and the etching the first layer (C).

In another embodiment, a method of etching a substrate in a chamber is provided. The method comprises (A) depositing a polymeric layer on a via formed in a silicon layer disposed on a substrate in an etch reactor, wherein a plasma source power of 4,500 Watts or greater is applied while depositing the polymeric layer, (B) etching the polymeric layer in the etch reactor to remove a portion of the polymeric layer at a bottom of the via exposing a portion of the silicon layer, wherein the plasma source power of 4,500 Watts or greater is applied while etching the polymeric layer, and (C) etching the exposed silicon layer in the etch reactor, wherein the plasma source power of 4,500 Watts or greater is applied while etching the exposed silicon layer, wherein a time for the depositing a polymeric layer (A) comprises less than 30% of a total cycle time for the depositing a polymeric layer (A), the etching the polymeric layer (B), and the etching the exposed silicon layer (C).

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to a substrate processing system and related methods, such as an etching/deposition method.

Figure 1:
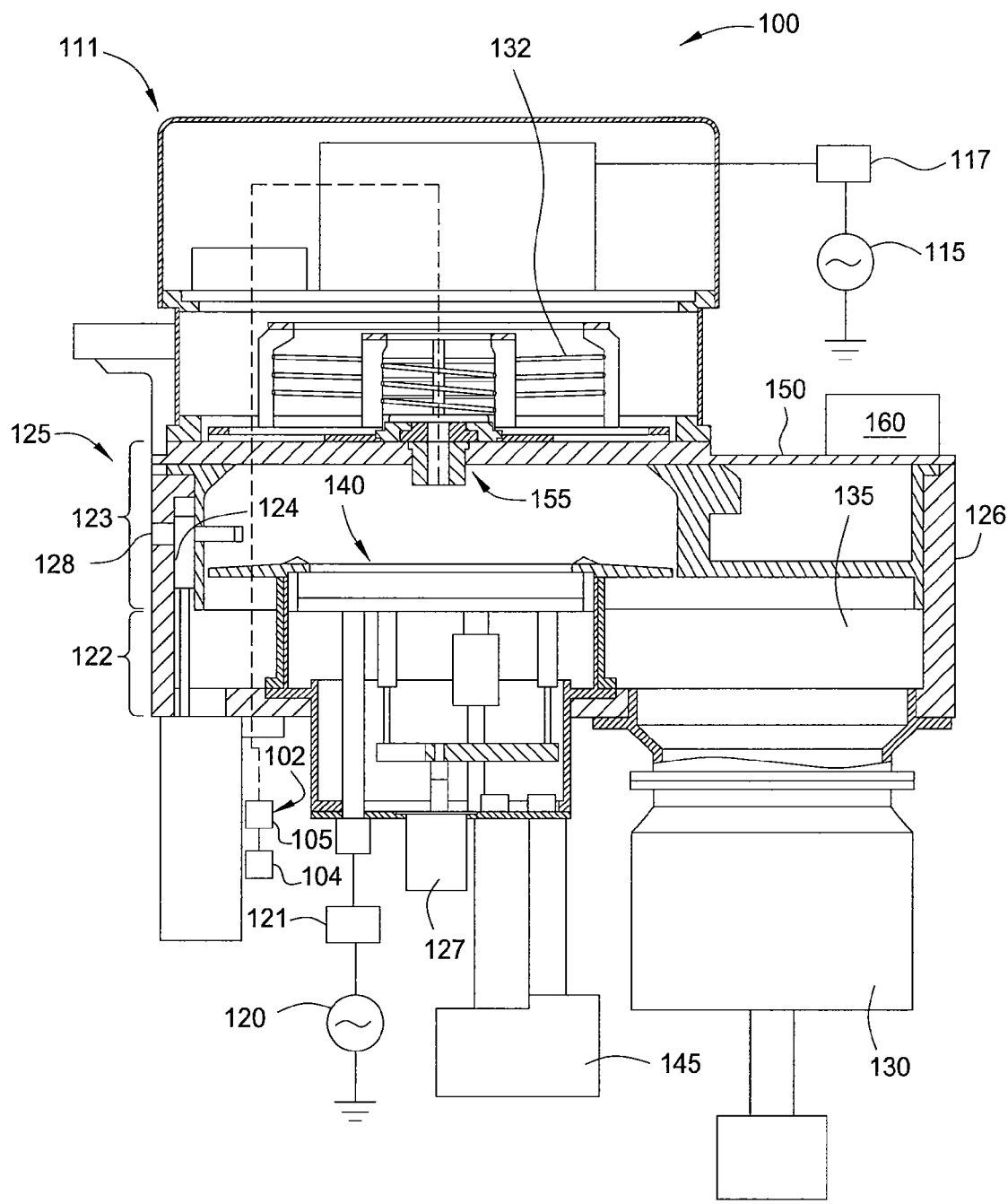
FIG. 1 illustrates a schematic cross-sectional view of a substrate etching system according to one embodiment of the invention.

Exemplary Apparatus:

FIG. 1 illustrates a sectional view of a system, such as a reactor 100, for processing a variety of substrates and accommodating a variety of substrate sizes. The substrate may be a round wafer having a 200 mm or a 300 mm diameter. The substrate can also be any polygonal, square, rectangular, curved or otherwise non-circular workpiece, such as a polygonal glass substrate used in the fabrication of flat panel displays. The reactor 100 may be part of an Applied CENTURA® Silvia Etch system which is available from Applied Materials of Santa Clara, Calif. It is noted that other reactors available from other manufacturers may also be utilized to practice the present invention.

In one embodiment, the reactor 100 may include a plasma power source 115 and a matching network 117, a bias power source 120 and a matching network 121, a chamber 125, a pump 130, a valve 135, an electrostatic chuck 140, a chiller 145, a lid 150, a gas nozzle 155, and a gas delivery system 102.

In one embodiment, the gas delivery system 102 is located in a housing 105 disposed directly adjacent, such as under, the chamber 125. The gas delivery system 102 selectively couples one or more gas sources located in one or more gas panels 104 to the gas nozzle 155 to provide process gases to the chamber 125. The housing 105 is located in close proximity to the chamber 125 to reduce gas transition time when changing gases, minimize gas usage, and minimize gas waste.

The reactor 100 may further include a lift 127 for raising and lowering the chuck 140 that supports a substrate in the chamber 125. The chamber 125 further includes a body 126 having a slit valve tunnel 128 selectively sealed by a door 124. The chamber 125 is lined by a lower liner 122 and an upper liner 123. The valve 135 may be disposed between the pump 130 and the chamber 125 and may be operable to control pressure within the chamber 125. The ceramic electrostatic chuck 140 is disposed within the chamber 125. The lid 150 is disposed on the body 126 of the chamber 125.

The gas nozzle 155 may comprise a tunable gas nozzle having one or more outlets to selectively direct gas flow from the gas delivery system 102 to the chamber 125. The gas nozzle 155 may be operable to direct gas flow into different areas within the chamber 125, such as the center area and/or the side areas of the chamber 125. In one embodiment, the gas nozzle 155 may include a first outlet that introduces gases downward from the top of the chamber 125 and a second outlet that introduces gases towards the sides of the chamber 125 to selectively control the radial distribution of the gases in the chamber 125.

The gas delivery system 102 may be used to supply at least two different gas mixtures to the chamber 125 at an instantaneous rate as further described below. In an optional embodiment, the reactor 100 may include a spectral monitor operable to measure the depth of an etched trench and a deposited film thickness as the trench is being formed in the chamber 125, with the ability to use other spectral features to determine the state of the reactor. The reactor 100 may be configured to accommodate a variety of substrate sizes, for example a substrate diameter of up to about 300 mm. In operation, and as will be discussed herein, the reactor 100 is configurable to produce etched substrate trench sidewall profiles having angles that taper in a range of about 85 degrees to about 92 degrees, and etched substrate trenches having depths that range from about 10 micrometers to about 500 micrometers.

In one embodiment, the reactor 100 may be coupled to a vacuum processing system that includes other substrate processing chambers.

In one embodiment, the plasma power source 115 for generating and maintaining a plasma process is coupled to the chamber 125 via a power transmitting apparatus 132 enclosed in a housing 111 disposed above the chamber 125. The power transmitting apparatus 132 may inductively or capacitively couple power to the gases within the chamber 125. In one embodiment depicted in FIG. 1, the power transmitting apparatus 132 is a pair of coaxial coils disposed above the chamber 125 to inductively couple power to gases within the chamber 125 to form an inductively coupled plasma (ICP). The plasma power source 115 may be operable to generate a radio frequency within a range from about 2 MHz to about 13.5 MHz, having pulsing capabilities, a power within a range from about 10 Watts to about 10,000 Watts, for example, from about 4,500 Watts to about 5,500 Watts and may further include a dynamic matching network 117. In one example, the plasma power source 115 may be operable to generate a 13 MHz radio frequency having pulsing capabilities. The plasma power source 115 may comprise a dual tunable source so that the radio frequency may be changed during an etching cycle. In one embodiment, the plasma power source 115 may comprise a remote plasma source capable of generating high levels of plasma disassociation that is mountable to the reactor 100. When using a remote plasma source, the reactor 100 may further include a plasma distribution plate or series of plates disposed in the chamber 125 to help distribute the plasma to the substrate. In one embodiment, the reactor 100 may include both an in-situ source power and a remote plasma source power, wherein the plasma is generated in a remote plasma chamber using the remote plasma source power and transferred to the reactor chamber 125, wherein the in-situ source power maintains the generated plasma within the chamber 125. In one embodiment, an etching cycle may be performed wherein the power range, i.e. the wattage of the plasma power source 115, may be increased or decreased during the etching cycle. The plasma power source 115 may be pulsed during the etching cycle.

In one embodiment, the bias power source 120 for biasing the substrate is coupled to the chamber 125 and the chuck 140. The bias power source 120 may be operable to generate a radio frequency of about 2 MHz having pulsing capabilities, a low power range from about 10 Watts to about 500 Watts, for example, from about 100 Watts to about 250 Watts, and may further include a dynamic matching network 121. In one embodiment, the bias power source 120 may be capable of generating a selectable radio frequency range from about 100 kHz to about 13.56 MHz, from about 100 kHz to about 2 MHz, and from about 400 kHz to about 2 MHz, having pulsing capabilities, a low power range from about 10 Watts to about 2,000 Watts, and may further include a dynamic matching network or a fixed matching network and a frequency tuner. In one embodiment, an etching cycle may be performed wherein the power range, i.e. the wattage of the bias power source 120, may be increased or decreased during the etching cycle. In one embodiment, an etching cycle may include deposition, a first etch, and a second etch, wherein the bias power source 120 is used during the first etch and the bias power source 120 is decreased or increased during the second etch. For example, the radio frequency of the bias power may be decreased or increased from the first etch to the second etch.

The bias power source 120 may be pulsed during the etching cycle. To pulse the bias power source 120, the radio frequency power is switched on and off during the etching cycle. The pulsing frequency of the bias power source 120 may range from about 10 Hz to about 1,000 Hz, and may range from about 50 Hz to about 180 Hz. In one embodiment, the switching of the power on and off is uniformly distributed in time throughout the etching cycle. In one embodiment, the timing profile of the pulsing may be varied throughout the etching cycle, and may depend on the composition of the substrate. The percentage of time the bias power source 120 is switched on, i.e. the duty cycle as described above, is directly related to the pulsing frequency. In one embodiment, when the pulsing frequency ranges from about 10 Hz to about 1000 Hz, the duty cycle ranges from about 30% to about 90%. The bias power frequency and the pulsing frequency may be adjusted depending on the substrate material being processed.

In one embodiment, the chiller 145 may be operable to control the temperature within the chamber 125 and of the substrate located within the chamber 125. The chiller 145 may be located near and coupled to chamber 125. The chiller 145 may include a low temperature chiller, such as a sub-zero point of use thermo-electric chiller, and may further include a direct cooling mechanism for ultra lower temperatures. The chiller 145 is operable to generate temperatures in the range of about −20 degrees to about 80 degrees Celsius, located near the chamber 125 to achieve a faster reaction time, and may include ramping capabilities to allow some level of control to help improve the etch rate. In one embodiment, the chiller 145 is capable of generating temperatures in the range of about −10 degrees to about 60 degrees Celsius and may be located near the chamber 125 to achieve a faster reaction time. In one embodiment, the chiller 145 may be operable to lower the temperature from about −10 degrees Celsius to about −20 degrees Celsius in the chamber 125.

In certain embodiments, the reactor 100 may include an additional cooling mechanism 160 for controlling the temperature of the reactor 100. The additional cooling mechanism 160 may be positioned on the lid 150 to control the temperature of the lid 150 which may exhibit an increased temperature due to the use of the increased source power. The additional cooling mechanism 160 may comprise one or more high cooling capacity fans.

In one embodiment, the reactor 100 is operable to maintain a chamber pressure range of about 10 mTorr to about 1,000 mTorr with the pump 130 and the valve 135, which is coupled to the chamber 125. The chamber pressure can be adjusted during the etching cycle to further improve the trench profiles. For example, the chamber pressure may be rapidly decreased or increased when switching from the deposition to the etch. The pump 130 may comprise a turbo pump, a 2,600 L/s turbo pump for example, operable to process flows in the range of about 100 sccm to about 1,000 sccm throughout the chamber 125. In conjunction with the pump 130, the valve 135 may comprise a throttling gate valve with a fast reaction time to help control the process flow and the pressure within the chamber 125. The reactor 100 may further include a dual manometer to measure the pressure in the chamber 125. In one embodiment, the pump 130 and the valve 135 of the reactor 100 are operable to maintain a dynamic pressure within the chamber 125 in the range of about 10 mTorr to about 250 mTorr, for example, from about 60 to about 150 mTorr, during the etching cycle. Optionally, an automatic throttling gate valve control or a valve with preset control points may be utilized, and the dynamic pressure may be sustained at a set-point while changing flow parameters.

Exemplary Methods:

Demand for smaller and lighter electronic devices with higher performance and more features is driving the adoption of 3D ICs designed with through silicon vias (TSVs). TSV etch is a critical unit process in the TSV integration and a cost effective etch solution is required to enable faster adoption of TSV technology in high volume. The cost of ownership of the TSV etch unit process is primarily determined by the overall silicon etch rate and innovative solutions are needed to achieve high silicon etch rates.

Time multiplexed polymerization and etch, commonly known as the Bosch process, alternates polymer deposition and etch to achieve high anisotropy for through silicon via and deep trench etching. The deposition cycle by itself does not contribute to increasing the overall etch rate, but it is necessary to have the deposition to maintain a high aspect ratio via and the required profile. From an etch rate standpoint, deposition is a hindrance to overall etch rate. Thus, it is believed that the throughput from the process which depends on both the etch rate as well as the deposition rate can be significantly improved by increasing the deposition rate of the polymeric film. As described herein, shorter deposition times can be obtained by using an enhanced ICP power source to promote faster deposition.

In certain embodiments described herein, the deposition rate of the polymeric film is increased by using a gas having a higher carbon/fluorine (C/F) gas ratio for polymerization in combination with a higher ICP source power. $C_4F_8$ is generally the baseline process gas used for polymer deposition in current generation processes with ICP source power of less than 3,000 Watts. In certain embodiments, a gas having a higher C/F ratio, such as $C_4F_6$, was used as the alternated deposition process gas due to its higher C/F ratio. As discussed herein, higher deposition rate studies were performed on blanket films using steady state deposition and subsequently transferred to the transient Bosch process.

Figures 2A, 2B, 2C:
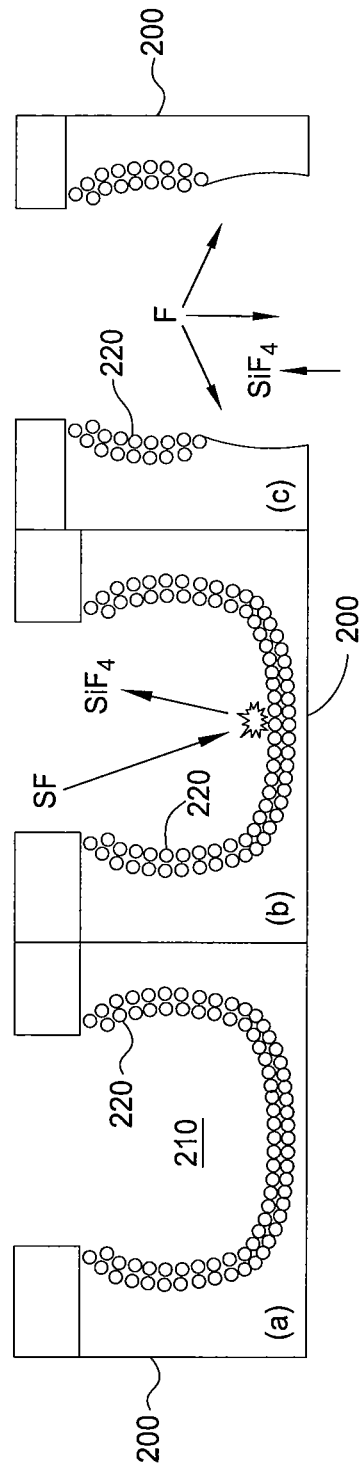
FIG. 2A illustrates a schematic cross-sectional view of a substrate after polymer deposition of the Bosch process.
FIG. 2B illustrates a schematic cross-sectional view of the substrate of FIG. 2A during polymer etch of the Bosch process.
FIG. 2C illustrates a schematic cross-sectional view of the substrate of FIG. 2B during silicon etch of the Bosch process.

FIGS. 2A-2C illustrate the mechanism of the Bosch process used for high aspect ratio silicon etch of a silicon substrate 200 having a via 210 formed therein. In the deposition, as shown in FIG. 2A, a thin protective layer of a polymeric film 220 is deposited across the exposed surface of the substrate 200. The polymeric film 220 may be formed from the dissociation products of a carbon/fluorine ($C_xF_y$) containing process gas in a plasma environment. In the subsequent etch, as shown in FIG. 2B, the polymeric film 220 is removed from the bottom of the via 210 by a directional bias etch while maintaining a portion of the polymeric film 220 along the sidewalls of the via 210. As shown in FIG. 2C, etching of the silicon substrate 200 is mostly accomplished by an isotropic etch with fluorine radicals. The polymer film 220 along the sidewall of the via 210 protects against the lateral etch making the process highly anisotropic.

Figure 3:
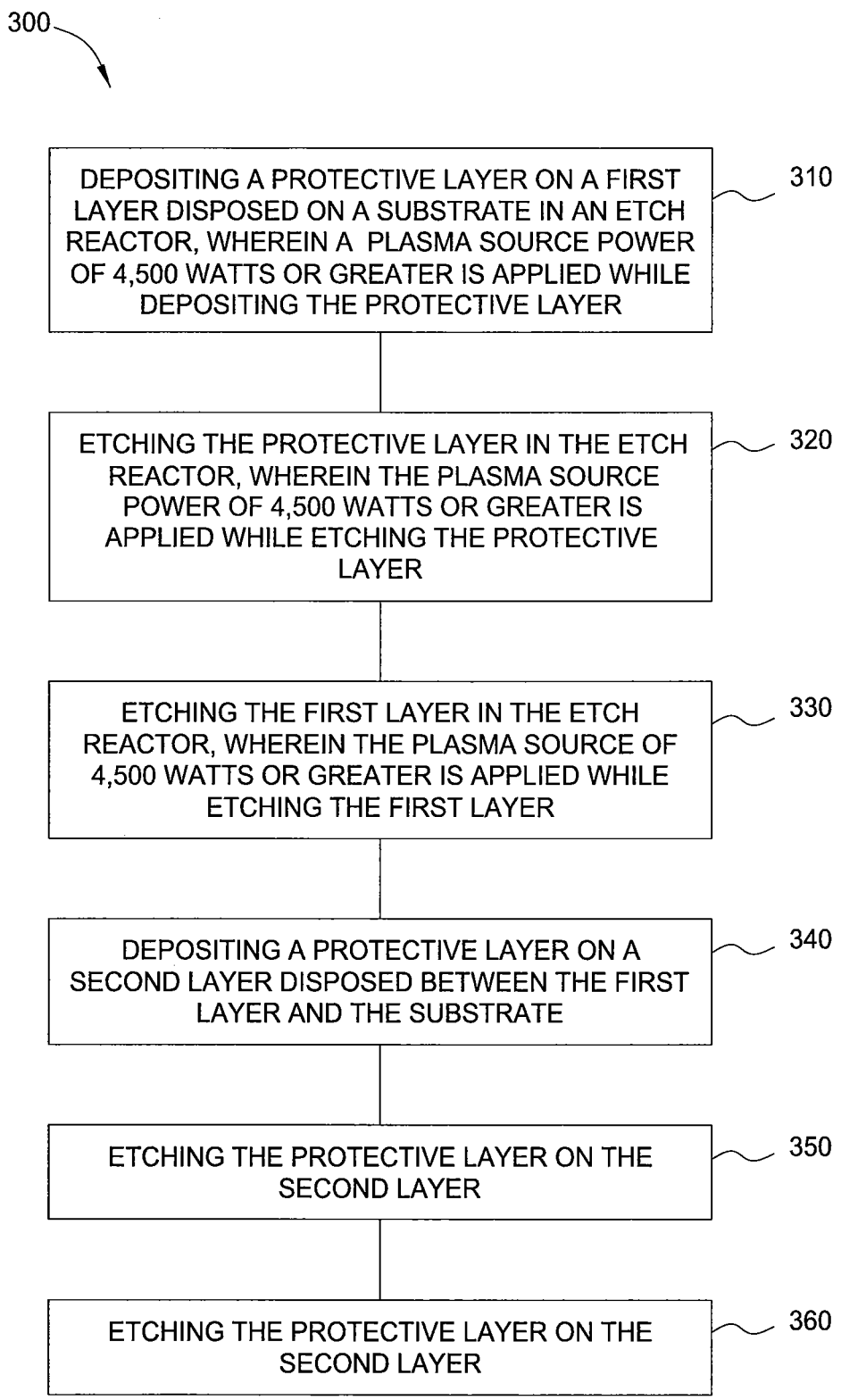
FIG. 3 is a flowchart illustrating one embodiment for etching a substrate according to embodiments described herein.

FIG. 3 is a flowchart 300 illustrating one embodiment for etching a substrate according to embodiments described herein. At block 310, a protective layer is deposited on a first layer disposed on a substrate in an etch reactor, wherein a plasma source power of 4,500 Watts or greater is applied while depositing the protective layer. At block 320, the protective layer is etched in the etch reactor, wherein the plasma source power of 4,500 Watts or greater is applied while etching the protective layer. At block 330, the first layer is etched in the etch reactor, wherein a time for the depositing the protective layer is less than 30% of a total cycle time for the depositing a protective layer, the etching the protective layer, and the etching the first layer. At block 340, a second protective layer is optionally deposited on a second layer disposed between the first layer and the substrate. At block 350, the second protective layer is etched in the etch reactor. At block 360, the second layer is etched in the etch reactor.

At block 310, a protective layer is deposited on a first layer disposed on a substrate in an etch reactor, wherein a plasma source power of 4,500 Watts or greater is applied while depositing the protective layer. The protective layer may comprise a polymeric material. Exemplary polymeric materials include polytetrafluoroethylene (PTFE). The substrate may comprise silicon or a silicon containing material. The first layer may comprise silicon or a silicon containing material. Exemplary silicon containing materials include silicon nitride, silicon oxide, or silicon oxynitride.

The plasma power source 115 may generate RF power at a frequency ranging from about 10 kHz to about 60 MHz. The plasma power source 115 may operate at a frequency ranging from about 2 MHz to about 13.56 MHz. The amount of RF power applied to obtain a desired plasma density typically ranges from about 3,000 Watts to about 10,000 Watts. The amount of RF power to obtain a desired plasma density may range from about 4,500 Watts to about 5,500 Watts. The amount of RF power to obtain a desired plasma density may be at least 2,500 Watts, 3,000 Watts, 3,500 Watts, 4,000 Watts, 4,500 Watts, 5,000 Watts, 5,500 Watts, 6,000 Watts, 6,500 Watts, 7,000 Watts, 7,500 Watts, 8,000 Watts, 9,000 Watts, or 9,500 Watts. The amount of RF power to obtain a desired plasma density may be up to 3,000 Watts, 3,500 Watts, 4,000 Watts, 4,500 Watts, 5,000 Watts, 5,500 Watts, 6,000 Watts, 6,500 Watts, 7,000 Watts, 7,500 Watts, 8,000 Watts, 9,000 Watts, 9,500 Watts, or 10,000 Watts.

The plasma source gas may be selected from the group consisting of $SF_6$, $NF_3$, $CF_4$, $C_4F_8$, $C_4F_6$, $CHF_3$, $CH_2F_2$, $ClF_3$, $BrF_3$, $IF_3$, and combinations thereof. In certain embodiments, where the material is a silicon containing material, such as silicon, silicon nitride, silicon oxide, or silicon oxynitride, the plasma source gas may consist of $C_4F_6$ and $SF_6$. The plasma source gas or source gases may have a flow rate from about 200 to about 1,000 sccm, for example, from about 200 to 500 sccm.

In certain embodiments, inert gases such as helium (He) and argon (Ar) may be used during the deposition process. The inert gas or inert gases may have a flow rate from about 200 to about 1,000 sccm, for example, from about 200 to 500 sccm.

The temperature of the substrate also affects the deposition rate and control of uniformity. The substrate surface may be maintained at a temperature between about −10 degrees Celsius to about 0 degrees Celsius. The temperature of the process chamber may be maintained between about 70 degrees Celsius to about 90 degrees Celsius. The temperature of the chamber wall may be from about 50 degrees Celsius and 100 degrees Celsius. The lid temperature may be from about 75 degrees Celsius to about 150 degrees Celsius.

Control of the pressure in the process chamber ensures that reaction by-products will be gaseous and will be removed easily and relatively rapidly from the process chamber. Typically the process chamber pressure during the polymeric deposition is controlled to be within the range of 60 to 150 mTorr.

At block 320, the protective layer is etched in the etch reactor, wherein the plasma power source of 4,500 Watts or greater is applied while etching the protective layer. The process conditions and process gases used during block 320 may be similar to the process conditions used for block 310 except that during the etching process of block 320, a biasing power is applied to the substrate.

To direct the plasma down into the feature on which the protective layer is deposited, the bias power is applied to the substrate. The bias power source may provide an RF power at a frequency ranging from about 10 kHz to about 13.56 MHz. The RF power frequency may range from about 1 MHz to about 4 MHz. One skilled in the art may adjust the power frequency in view of the protective layer being etched.

The bias power may range from 50 Watts to about 400 Watts. The bias power may range from about 120 Watts to about 250 Watts. The bias power may be pulsed. To pulse the biasing power, the RF power may be switched on and off during the etching the protective layer. The pulsing frequency of the biasing power may range from about 10 Hz to about 1,000 Hz. The pulsing frequency of the biasing power may range from about 50 Hz to about 180 Hz. The switching of the power on and off may be uniformly distributed in time throughout the etching of the protective layer. The timing profile of the pulsing may be varied depending on the composition of the polymeric layer. The percentage of time the plasma biasing RF power is switched on which is referred to as the "duty cycle %" is directly related to the pulsing frequency. When the pulsing frequency ranges from about 50 Hz to about 180 Hz, the corresponding duty cycle % often ranges from about 30% to about 90%. One skilled in the art may adjust the RF power frequency and the pulsing frequency to work with the particular material which is being etched.

At block 330, the first layer is etched in the etch reactor. The process conditions and process gases used during block 330 may be similar to the process conditions used for block 310. Etching the first layer typically exposes a second layer underlying the first layer.

At block 340, a second protective layer is optionally deposited on a second layer disposed between the first layer and the substrate. The second protective layer may be a polymeric layer. The polymeric material may be the same as the polymeric material used to form the first protective layer as described above. The second layer may comprise silicon or a silicon containing material. The second layer may comprise the same material as the first layer describe above. The second layer is typically exposed by etching of the first layer. The second protective layer may be deposited using the same or similar process conditions as discussed above at block 310 for depositing a protective layer on the first layer.

At block 350, the second protective layer is etched in the etch reactor. The second protective layer may be etched using the same or similar process conditions and process gases used during block 320.

At block 360, the second layer is etched in the etch reactor. The second layer may be etched using the same or similar process conditions and process gases used during block 330.

As used herein, the total cycle time refers to the time for performing one cycle of depositing a protective layer, etching the protective layer, and etching the layer underlying the protective layer. For example, block 310, 320, and 330 constitue one cycle and block 310, 320, and 330 constistute a second cycle. A cycle may be performed any number of times until a desired via depth is achieved. One skilled in the art would be able to determine the number of cycles required to achieve a particular etch depth.

In certain embodiments the depositing a protective layer is performed for a time period of between 0.5 and 1 second. In certain embodiments, the etching the protective layer is performed for a time period between 0.5 and 1.5 seonds. In certain embodiments, the etching the first layer is peformed for a time period between 0.5 and 1.5 seconds. In certain embodiments, the time for depositing a protective layer comprises less than 30% of a total cycle time for depositing a protective layer, etching the protective layer, and etching the first layer.

Figures 4A, 4B:
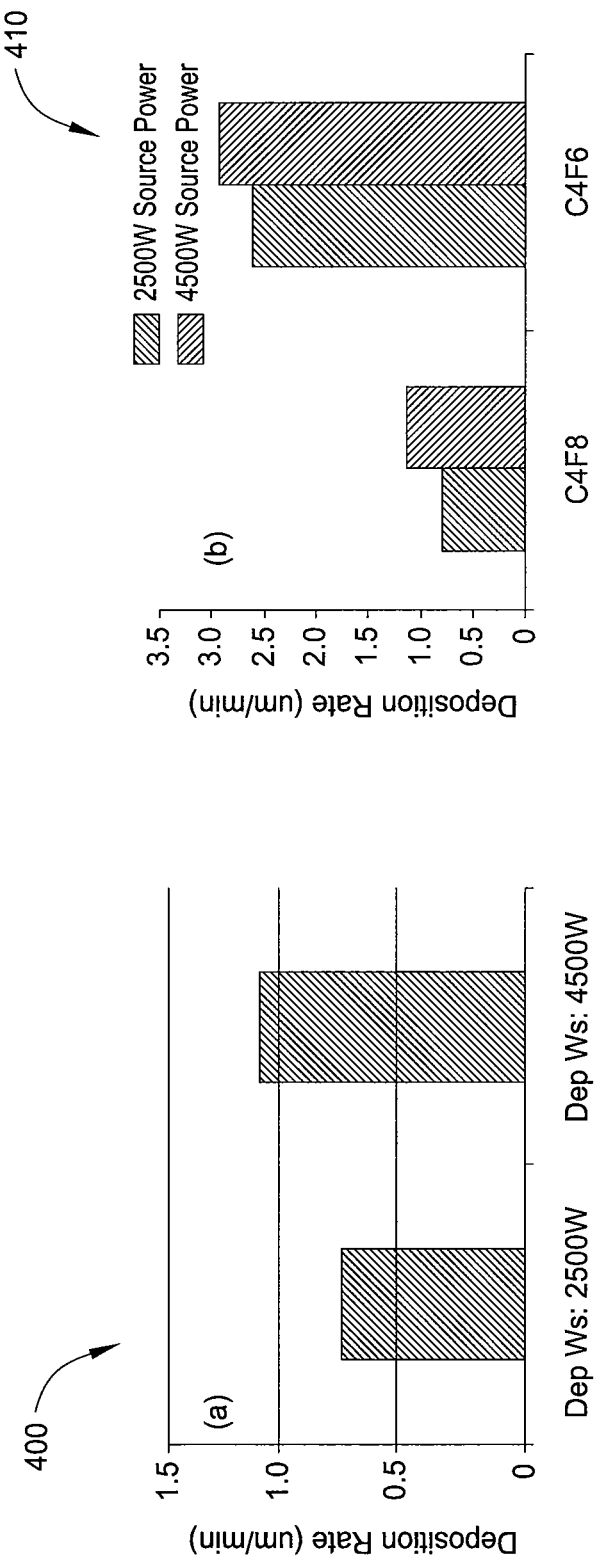
FIG. 4A is a plot illustrating the effect of higher inductively coupled plasma (ICP) source power on polymer deposition rate according to embodiments described herein.
FIG. 4B is a plot illustrating the use of lower carbon/fluorine (C/F) ratio process gas on polymer deposition rate according to embodiments described herein.

FIG. 4A is a plot 400 illustrating the effect of a higher inductively coupled plasma (ICP) power source on polymer deposition rate. The y-axis represents polymer deposition rate (μm/minute) and the x-axis represents a plasma power source of 2,500 Watts and 4,500 Watts respectively. As the ICP source power was increased from 2,500 Watts to 4,500 Watts, the polymer deposition rate increased by approximately 40% as shown in FIG. 4A. Not to be bound by theory, but the increase in polymer deposition rate with higher source power is believed to be attributed to the higher dissociation of deposition process gas.

FIG. 4B is a plot 410 illustrating the use of lower carbon/fluorine ($C_X/F_Y$) ratio process gas on a polymer deposition rate. The y-axis represents polymer deposition rate (μm/minute) and the x-axis represents a gas type of $C_4F_8$ and $C_4F_6$ respectively. As shown in FIG. 4B, switching the deposition process gas from a lower C/F ratio gas ($C_4F_8$) to a higher C/F ratio gas ($C_4F_6$) increased the polymer deposition rate by approximately 150%.

Figures 5A, 5B, 5C:
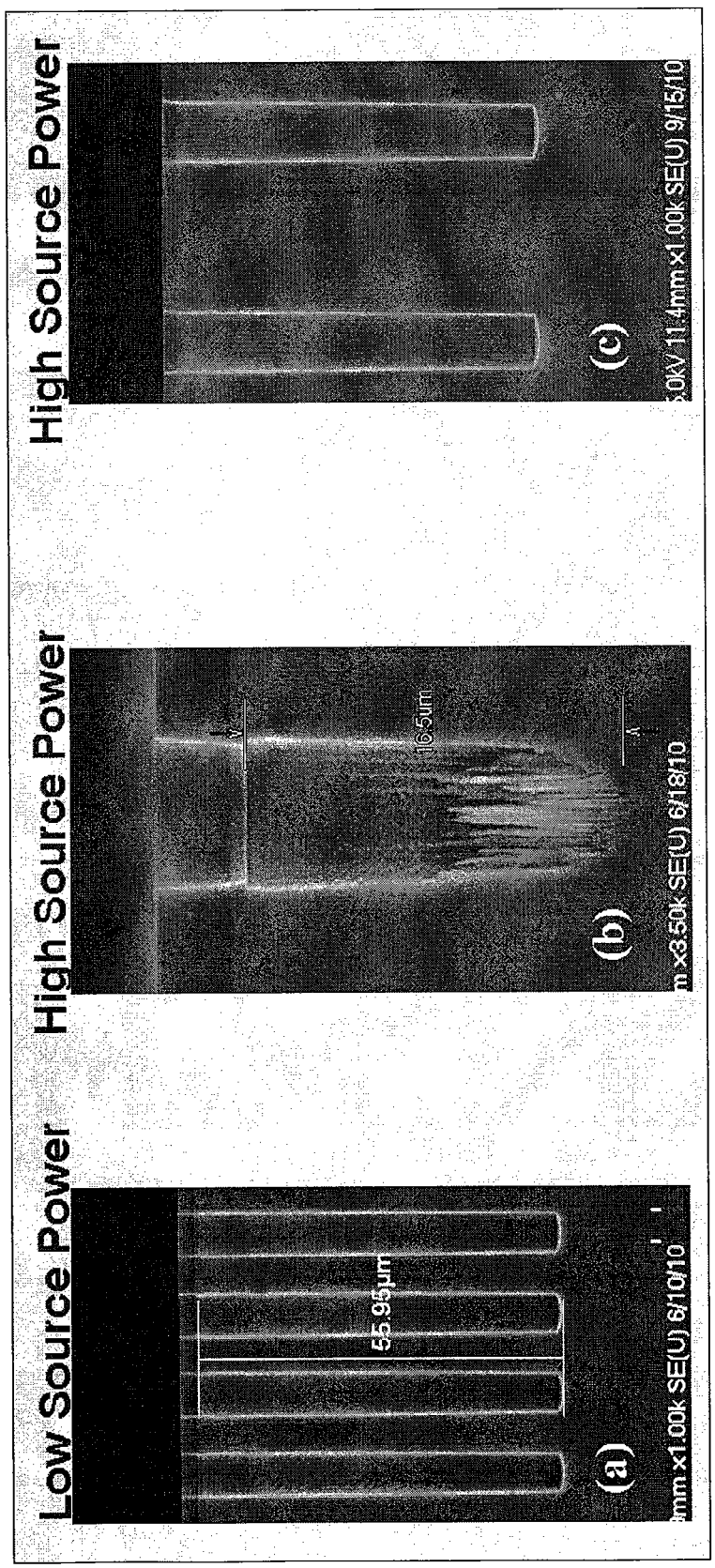
FIG. 5A is a micrograph illustrating a via profile obtained after an etching/deposition process performed using a prior art process at low ICP source power.
FIG. 5B is a micrograph illustrating a via profile obtained after an etching/deposition process performed at high ICP source power according to embodiments described herein.
FIG. 5C is a micrograph illustrating a via profile obtained after an etching/deposition process performed at high ICP source power and a low deposition time according to embodiments described herein.

FIG. 5A illustrates a via profile obtained at 2,500 Watts ICP source power. As the ICP source power was increased to 4,500 Watts, both the deposition and etch rate are expected to increase due to the higher dissociation of process gases. However, the increase in deposition rate is much higher than the etch rate resulting in thicker polymer deposition and subsequent etch stop as shown in FIG. 5B. Tuning of the Bosch process to achieve a desired via profile at higher source power has since been done by lowering the deposition time to address the increased deposition rate as shown in FIG. 5C. However, in some embodiments, merely increasing the source power may result in significant via profile issues such as micro-column or "micro-grass" formation at the bottom of the via.

With an increase in source power from 2,500 Watts to 4,500 Watts, the overall TSV etch rate increased by 60%. Not to be bound by theory, but it is believed that the increase in etch rate was partly due to the increase in the polymer deposition rate and also due to higher dissociation of the etchant gas (e.g. $SF_6$) used during the etch. Also, an increase in deposition rate due to increased source power, coupled with higher C/F ratio gas is expected to increase the overall etch rate by another 20%.

EXAMPLES:

The following non-limiting examples are provided to further illustrate embodiments described herein. However, the examples are not intended to be all inclusive and are not intended to limit the scope of the embodiments described herein.

Etch experiments were conducted on 300 mm wafers in a SILVIA™ TSV plasma etch chamber available from Applied Materials Inc, of Santa Clara, Calif., configured to supply high gas flow rates and plasma powers. The etch experiments were conducted using the following parameters and process gases:

TABLE I

Polymer Deposition Process Conditions

| Process Parameter | Range of Process Conditions | Typical Process Conditions |
| --- | --- | --- |
| $C_4F_8$ flow rate (sccm) | 200-1,000 | 200-500 |
| He flow rate (sccm) | 0-400 | 0 |
| Ar flow rate (sccm) | 0-200 | 0 |
| RF Parameters | | |
| Plasma Source Power (W) | 3,000-10,000 | 4,500-5,500 |
| Plasma Source Power frequency (MHz) | 1-60 | 2-13.56 |
| Source Pulsing | None | None |
| Substrate Bias power (W) | 0 | 0 |
| Biasing Power frequency (kHz) | 0 | 0 |

TABLE I-continued

Polymer Deposition Process Conditions

| Process Parameter | Range of Process Conditions | Typical Process Conditions |
|---|---|---|
| Bias Power Pulsing (duty time %/pulsing frequency Hz) | 0 | 0 |
| Other Parameters | | |
| Pressure (mTorr) | 50-200 mT | 60-150 mT |
| ESC Temperature (° C.) | | −10 to 0 |
| Chamber Temperature (° C.) | 50 to 100 | 70 to 90 |
| Time (sec) | 0.2 to 1.5 | 0.5 to 1 |

TABLE II

Polymer Etch Process Conditions

| Process Parameter | Range of Process Conditions | Typical Process Conditions |
|---|---|---|
| $SF_6$ flow rate (sccm) | 200-1,000 | 200-500 |
| He flow rate (sccm) | 0-400 | 0 |
| Ar flow rate (sccm) | 0-200 | 0 |
| RF Parameters | | |
| Plasma Source Power (W) | 3,000-10,000 | 4,500-5,500 |
| Plasma Source Power frequency (MHz) | 1-60 | 2-13.56 |
| Source Pulsing | | |
| Substrate Bias power (W) | | 120-150 |
| Biasing Power frequency (kHz) | 10-13.56 | 14 |
| Bias Power Pulsing (duty time %/pulsing frequency Hz) | 0 | 30-90% |
| Other Parameters | | |
| Pressure (mTorr) | | 60-150 mT |
| ESC Temperature (° C.) | | −10 to 0 |
| Chamber Temperature (° C.) | | 70 to 90 |
| Time (sec) | | 0.5 to 1 |

TABLE III

Silicon Etch Process Conditions

| Process Parameter | Range of Process Conditions | Typical Process Conditions |
|---|---|---|
| $SF_6$ flow rate (sccm) | 200-1,000 | 200-500 |
| $C_4F_8$ flow rate (sccm) | 200-1,000 | 200-500 |
| He flow rate (sccm) | 0-400 | 0 |
| Ar flow rate (sccm) | 0-200 | 0 |
| RF Parameters | | |
| Plasma Source Power (W) | 3,000-10,000 | 4,500-5,500 |
| Plasma Source Power frequency (MHz) | 1-60 | 2-13.56 |
| Source Pulsing | | |
| Substrate Bias power (W) | | |
| Biasing Power frequency (kHz) | | |
| Bias Power Pulsing (duty time %/pulsing frequency Hz) | | |
| Other Parameters | | |
| Pressure (mTorr) | 50-200 | 60-150 mT |
| ESC Temperature (° C.) | | −10 to 0 |
| Chamber Temperature (° C.) | 50-100 | 70 to 90 |
| Time (sec) | 0.2-1.5 | 0.5 to 1 |

Experimental results show that the time-multiplexed silicon etch process is highly influenced by ICP power source, i.e. plasma power source driven. Increasing the plasma source power greatly increases both the polymer deposition rate during the deposition cycle, as well as the etch rate in the etch by enhancing the reactive radical concentrations in plasma environment rather than increase in individual ion energy of the etch species. For a balanced etch and deposition process, the etch can remove the polymer on the via bottom created during the deposition before the silicon etch. However, increased ICP source power may break the balance between the etch and deposition. When deposition increases too fast with the increase in power source, the polymer residue on the via bottom can function as a micromask and then prevent the local etch, resulting in the micrograss.

In order to balance the deposition and etch, increasing the polymer etch rate during the etch by increasing the gas flow rates and shortening the deposition time were used. However, high flow and source power process windows for time-multiplexed etch of silicon may introduce other challenges such as large scallops, and higher deposition rate that could potentially lead to striations via grass or in the worst case scenario an etch stop as show in FIG. 5B. Thus increase in gas flows and source power may cause a non-desirable profile even if it has a higher etch rate.

Figure 6:
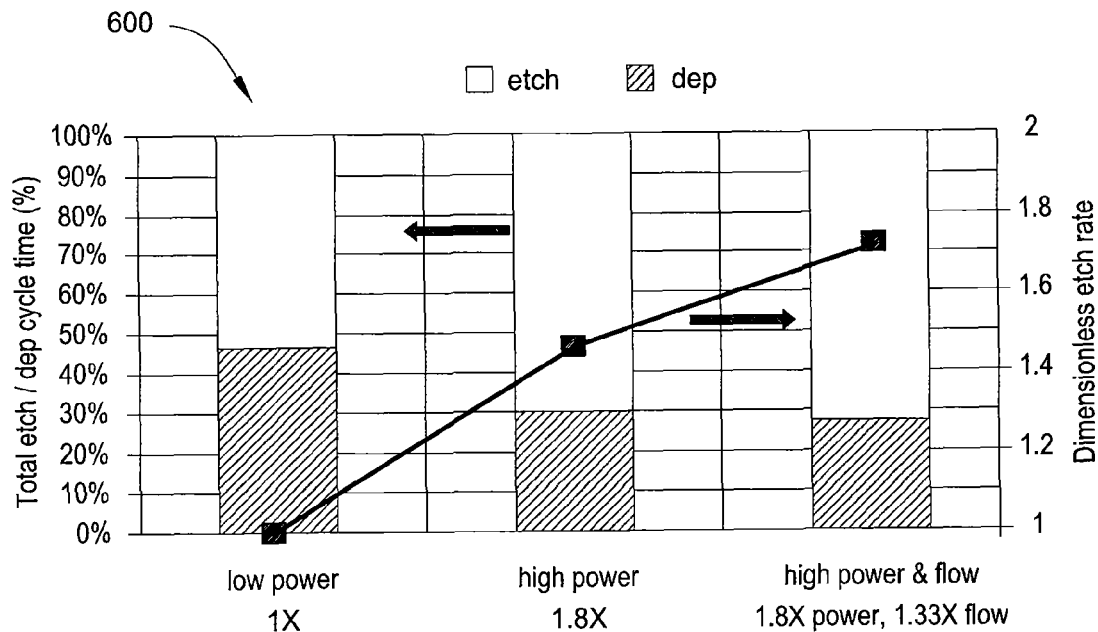
FIG. 6 is a plot illustrating the relationship between etch rate, source power, flow rates and etch/deposition cycle times.

FIG. 6 is a plot illustrating 600 the relationship between etch rate, source power, flow rates and etch/deposition cycle times. The left y-axis represents a percentage of the total etch/deposition cycle time. The right y-axis represents dimensionless etch rate. The x-axis represents a first etch/deposition cycle performed at low power (X), a second etch-deposition cycle performed at high power (1.8X), and a third etch/deposition cycle performed at both high power (1.8X) and increased gas flow rates (1.33X). Dimensionless gas flow, etch rate, and source power are used which are defined as the experimental rates and power divided by baseline rates and power before optimization. As shown in the plot 600 of FIG. 6, increasing gas flow rates by 33% and source power by 80% yielded a significant increase in the overall silicon etch rate.

Figure 7:
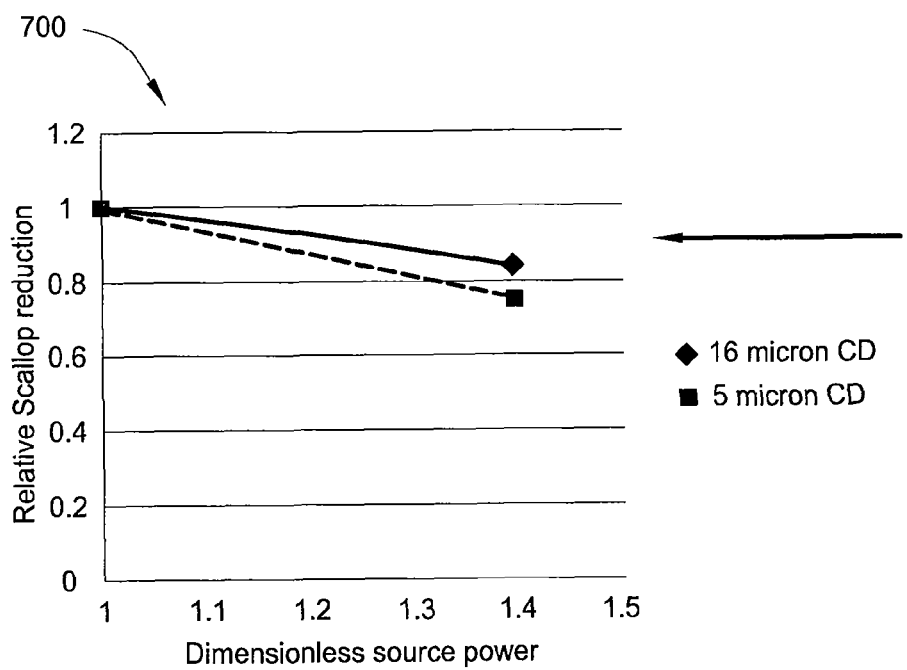
FIG. 7 is a plot illustrating scallop size improvement with an increase in source power according to embodiments described herein.

FIG. 7 is a plot 700 illustrating scallop size improvement with an increase in source power according to embodiments described herein. The x-axis represents dimensionless source power and the y-axis represents relative scallop reduction. As shown in plot 700, the etch rate increase is a function of the via diameter and also the via depth, i.e. the function of via aspect ratio. By using a process with high etch rate, a profile with good scallop sidewall control was obtained as shown in FIG. 7.

Figure 8:
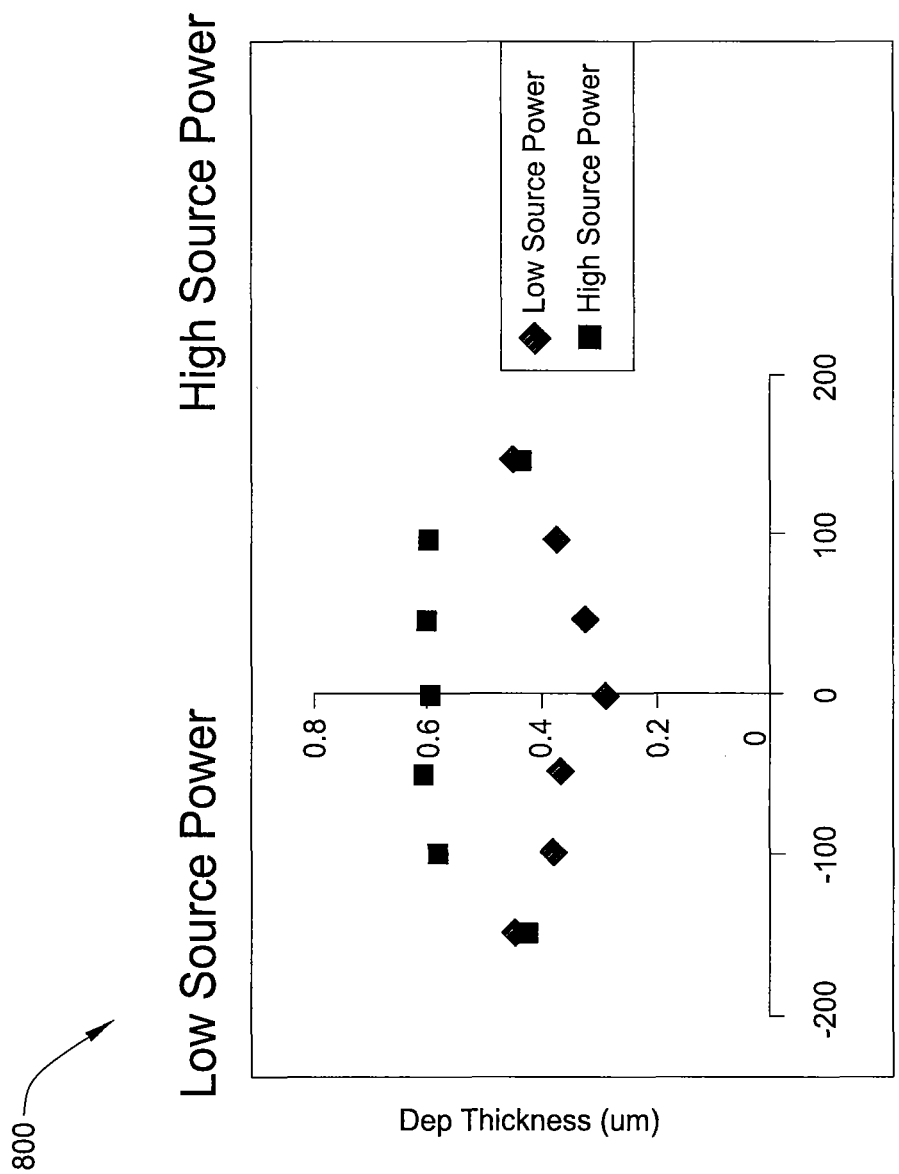
FIG. 8 is a plot illustrating polymer deposition thickness at different source powers.

FIG. 8 is a plot 800 illustrating polymer deposition thickness at different source powers. The y-axis represents the polymer deposition thickness in microns and the x-axis represents the diameter of the substrate.

While the foregoing is directed to embodiments of the invention, other and further embodiments of the invention may be devised without departing from the basic scope thereof.

What is claimed is:

1. A method of etching a substrate in a chamber comprising:
   (A) depositing a protective layer on a first layer disposed on a substrate in an etch reactor, wherein a plasma source power of 4,500 Watts or greater is applied while depositing the protective layer;
   (B) etching the protective layer in the etch reactor, wherein the plasma source power of 4,500 Watts or greater is applied while etching the protective layer; and
   (C) etching the first layer in the etch reactor, wherein the plasma source power of 4,500 Watts or greater is applied while etching the first layer, wherein a time for the depositing the polymeric layer (A) comprises less than 30% of a total cycle time for the depositing the polymeric layer (A), the etching the protective layer (B), and the etching the first layer (C).

2. The method of claim 1, wherein the plasma source power is between 4,500 Watts and 5,500 Watts.

3. The method of claim 2, wherein the plasma source power includes a radio frequency (RF) range between 2 to 13.56 MHz.

4. The method of claim 1, further comprising applying a bias power to the substrate between 120 Watts to 250 Watts while (B) etching the polymeric layer.

5. The method of claim 4, further comprising pulsing the bias power within a duty cycle range of 30 to 90%.

6. The method of claim 1, wherein the first layer includes silicon.

7. The method of claim 1, wherein the polymeric film is polytetrafluoroethylene (PTFE).

8. The method of claim 1, further comprising:
   (D) depositing a protective layer on a second layer disposed between the first layer and the substrate;
   (E) etching the protective layer on the second layer; and
   (F) etching the second layer.

9. The method of claim 1, wherein the depositing the polymeric layer is performed for a time period of between 0.5 and 1 second, wherein the etching the polymeric layer is performed for a time period between 0.5 and 1.5 seonds, and wherein the etching the first layer is peformed for a time period between 0.5 and 1.5 seconds.

10. The method of claim 9, further comprising:
   flowing $SF_6$ into the etch reactor at a flow rate between 200 and 500 sccm; and
   flowing $C_4F_8$ into the etch reactor at a flow rate between 200 and 500 sccm, wherein the flowing $SF_6$ and flowing $C_4F_8$ occur while (A) depositing the polymeric layer, (B) etching the protective layer, and (C) etching the first layer.

11. A method of etching a substrate in a chamber comprising:
   (A) depositing a polymeric layer on a via formed in a silicon layer disposed on a substrate in an etch reactor, wherein a plasma source power of 4,500 Watts or greater is applied while depositing the polymeric layer;
   (B) etching the polymeric layer in the etch reactor to remove a portion of the polymeric layer at a bottom of the via exposing a portion of the silicon layer, wherein the plasma source power of 4,500 Watts or greater is applied while etching the polymeric layer; and
   (C) etching the exposed silicon layer in the etch reactor, wherein the plasma source power of 4,500 Watts or greater is applied while etching the exposed silicon layer, wherein a time for the depositing the polymeric layer (A) comprises less than 30% of a total cycle time for the depositing the polymeric layer (A), the etching the polymeric layer (B), and the etching the exposed silicon layer (C).

12. The method of claim 11, wherein the plasma source power is between 4,500 Watts and 5,500 Watts.

13. The method of claim 12, wherein the plasma source power includes a radio frequency (RF) range between 2 to 13.56 MHz.

14. The method of claim 11, further comprising applying a bias power to the substrate between 120 Watts to 250 Watts while (B) etching the polymeric layer.

15. The method of claim 14, further comprising pulsing the bias power within a duty cycle range of 30 to 90%.

16. The method of claim 11, further comprising:
   (D) depositing a polymeric layer on a second silicon layer disposed between the silicon layer and the substrate;
   (E) etching the polymeric layer on the silicon layer; and
   (F) etching the second silicon layer.

17. The method of claim 11, wherein the depositing the polymeric layer is performed for a time period of between 0.5 and 1 second, wherein the etching the polymeric layer is performed for a time period between 0.5 and 1.5 seonds, and wherein the etching the first layer is peformed for a time period between 0.5 and 1.5 seconds.

18. The method of claim 17, further comprising:
   flowing $SF_6$ into the etch reactor at a flow rate between 200 and 500 sccm; and
   flowing $C_4F_8$ into the etch reactor at a flow rate between 200 and 500 sccm, wherein the flowing $SF_6$ and flowing $C_4F_8$ occur while (A) depositing the polymeric layer, (B) etching the polymeric layer, and (C) etching the silicon layer.

19. The method of claim 18, wherein the polymeric layer is polytetrafluoroethylene (PTFE).

20. A method of etching a substrate in a chamber comprising:
   (A) depositing a polymeric layer on a via formed in a silicon layer disposed on a substrate in an etch reactor, wherein a plasma source power of an inductively coupled plasma source of 4,500 Watts or greater is applied while depositing the polymeric layer;
   (B) etching the polymeric layer in the etch reactor to remove a portion of the polymeric layer at a bottom of the via exposing a portion of the silicon layer, wherein the plasma source power of 4,500 Watts or greater is applied while etching the polymeric layer;
   (C) etching the exposed silicon layer in the etch reactor, wherein the plasma source power of 4,500 Watts or greater is applied while etching the exposed silicon layer, wherein a time for the depositing the polymeric layer (A) comprises less than 30% of a total cycle time for the depositing the polymeric layer (A), the etching the polymeric layer(B), and the etching the exposed silicon layer (C);
   flowing $SF_6$ into the etch reactor; and
   flowing $C_4F_6$ into the etch reactor, wherein the flowing $SF_6$ and flowing $C_4F_6$ occur while (A) depositing the polymeric layer, (B) etching the polymeric layer, and (C) etching the silicon layer.

* * * * *

UNITED STATES PATENT AND TRADEMARK OFFICE
CERTIFICATE OF CORRECTION

PATENT NO. : 9,023,227 B2  
APPLICATION NO. : 13/480967  
DATED : May 5, 2015  
INVENTOR(S) : Dinev et al.

Page 1 of 2

It is certified that error appears in the above-identified patent and that said Letters Patent is hereby corrected as shown below:

In the Specification:

In Detailed Description:

Column 8, Line 11, please delete "Wafts" and insert --Watts-- therefor;

Column 9, Lines 41-42, please delete "constitue" and insert --constitute-- therefor;

Column 9, Line 42, please delete "constistute" and insert --constitute-- therefor;

Column 9, Line 50, please delete "seonds" and insert --seconds-- therefor;

Column 9, Line 51, please delete "peformed" and insert --performed-- therefor;

In the Claims:

Column 13, Claim 1, Line 4, please delete "protective" and insert --polymeric-- therefor;

Column 13, Claim 1, Line 7, please delete "protective" and insert --polymeric-- therefor;

Column 13, Claim 1, Line 8, please delete "protective" and insert --polymeric-- therefor;

Column 13, Claim 1, Line 10, please delete "protective" and insert --polymeric-- therefor;

Column 13, Claim 1, Line 16, please delete "protective" and insert --polymeric-- therefor;

Column 13, Claim 5, Line 27, please insert --%-- after 30;

Column 13, Claim 7, Line 30, please delete "film" and insert --layer-- therefor;

Column 13, Claim 8, Line 33, please delete "protective" and insert --polymeric-- therefor;

Signed and Sealed this  
Twenty-fourth Day of November, 2015

Michelle K. Lee  
*Director of the United States Patent and Trademark Office*

CERTIFICATE OF CORRECTION (continued)
U.S. Pat. No. 9,023,227 B2

Column 13, Claim 8, Line 35, please delete "protective" and insert --polymeric-- therefor;

Column 13, Claim 9, Line 40, please delete "seonds" and insert --seconds-- therefor;

Column 13, Claim 9, Line 41, please delete "peformed" and insert --performed-- therefor;

Column 13, Claim 10, Line 49, please delete "protective" and insert --polymeric-- therefor;

Column 14, Claim 15, Line 16, please insert --%-- after 30;

Column 14, Claim 17, Line 24, please delete "seonds" and insert --seconds-- therefor;

Column 14, Claim 17, Line 25, please delete "peformed" and insert --performed-- therefor.